United States Patent
Nakano

(10) Patent No.: US 6,681,361 B1
(45) Date of Patent: Jan. 20, 2004

(54) SEMICONDUCTOR DEVICE INSPECTION APPARATUS AND SEMICONDUCTOR DEVICE INSPECTION METHOD

(75) Inventor: Masahito Nakano, Tokyo (JP)

(73) Assignee: NEC Electronics Corporation, Tokyo (JP)

( * ) Notice: Subject to any disclaimer, the term of this patent is extended or adjusted under 35 U.S.C. 154(b) by 0 days.

(21) Appl. No.: 09/565,505

(22) Filed: May 5, 2000

(30) Foreign Application Priority Data

May 10, 1999 (JP) ............................................ 11-129281

(51) Int. Cl.[7] .......................... G06F 11/00; G01R 31/28; H03K 19/00
(52) U.S. Cl. ........................... 714/736; 324/763; 326/16
(58) Field of Search ................................. 714/724, 736; 324/763; 326/16

(56) References Cited

U.S. PATENT DOCUMENTS

| | | | | |
|---|---|---|---|---|
| 5,438,599 A | * | 8/1995 | Lincoln | 377/20 |
| 5,512,842 A | * | 4/1996 | Kida | 324/765 |
| 5,818,849 A | * | 10/1998 | Komatsu | 714/724 |
| 5,828,457 A | * | 10/1998 | Tabata et al. | 356/394 |
| 5,936,726 A | * | 8/1999 | Takeda et al. | 356/237.2 |
| 6,136,618 A | * | 10/2000 | Sanada | 438/17 |
| 6,243,841 B1 | * | 6/2001 | Mydill | 714/724 |
| 6,421,457 B1 | * | 7/2002 | Su | 382/149 |

FOREIGN PATENT DOCUMENTS

| | | |
|---|---|---|
| JP | 59-87377 | 5/1984 |
| JP | 63-064335 | 3/1988 |
| JP | 4-12286 | 1/1992 |
| JP | 5-011020 | 1/1993 |
| JP | 05-188119 | 7/1993 |
| JP | 06-281692 | 10/1994 |
| JP | 8-147369 | 6/1996 |
| JP | 8-184643 | 7/1996 |
| JP | 8-262102 | 10/1996 |
| JP | 8-334548 | 12/1996 |

* cited by examiner

*Primary Examiner*—Albert Decady
*Assistant Examiner*—Esaw Abraham
(74) *Attorney, Agent, or Firm*—Katten Muchin Zavis Rosenman

(57) ABSTRACT

A semiconductor device handler includes a handler section and a measurement section. A reference sample is mounted into a plurality of DUT sections provided in the measurement section. A prescribed test item of the reference sample is stored. A test item with regard to the reference sample is measured and the results of the measurement are stored. Difference values are calculated between the measured value of the reference sample in each of the DUT sections and the stored prescribed test item's values of the reference sample. A compensation value is determined for each of the DUT sections. The compensation values established for each DUT section are used in executing prescribed inspection processing for each semiconductor device unit under test in each DUT section. A prescribed characteristics value is determined for each of the semiconductor devices. The devices under test are classified into prescribed categories according to the inspection results.

15 Claims, 5 Drawing Sheets

REFERENCE SAMPLE MOVEMENT PATH

REFERENCE SAMPLE STAGE

CONDITION 1

CONDITION 2

CONDITION 3

SEMICONDUCTOR DEVICE INSPECTION APPARATUS AND SEMICONDUCTOR DEVICE INSPECTION METHOD

BACKGROUND OF THE INVENTION

1. Field of the Invention

The present invention relates to a testing equipment of the semiconductor device and a method for testing a semiconductor device, and more particularly to an equipment that performs prescribed inspection and measurement of a plurality of semiconductor devices under test (DUTs) in the measurement part of a device handler and that sorts the semiconductor devices by quality, and to a method for performing such a semiconductor device inspection and sorting.

2. Description of Related Arts

In the past, the testing equipment of the semiconductor device which performed an inspection on a plurality of semiconductor devices simultaneously and classified the devices under test into categories according to the grade, having a function of moving a tray within a device handler and measurement section that inspects a prescribed characteristic value was know, for example from the disclosure in Japanese Unexamined Patent Publication (KOKAI) No. 8-262102.

In the prior art, however, collection of data from each measurement section of the testing equipment for a reference sample (known as correlation) was performed at startup, at periodic inspections, and when an abnormality occurred.

In the above cases, because data collection was not possible without human intervention, the required labor, setup, calculation of compensation values, and program modifications required time and labor, so that the correlation process placed a burden on technical personnel.

In particular, because inspection capability and inspection accuracy with respect to prescribed characteristics of each DUTs provided within the measurement section exhibit variations, unless correlation is done carefully, classification and categorization of the semiconductor devices based on the measurement results will often include error and be lacking in accuracy.

In the above-noted Japanese Unexamined Patent Publication (KOKAI) No. 8-262102, there is in particular a disclosure of technology whereby a device that is judged bad at the first measurement is measured once again. However, there is no disclosure with regard to an automatic method for performing correlation considering the variation of measurement accuracies between individual DUTs of a plurality of DUTs.

In Japanese Unexamined Patent Publication (KOKAI) No. 63-64335, there is a configuration whereby image processing technology is used to perform efficient positioning of an IC package that is fed at the handler with a test connector. However, there is therein no disclosure of technology for improvement with regard to the variation in the measurement accuracy at the DUT section.

In Japanese Unexamined Patent Publication (KOKAI) No.s 8-147369 and 5-11020, there is language with regard to a semiconductor device inspection method whereby measurement values for a given lot are stored beforehand, and wherein a reference value for measurement values with respect to the semiconductor devices of the same lot are statistically determined based on this stored measurement information, a comparison being made between the reference values and measured values. There is therein, however, no disclosure of technology for improving variation in measurement accuracy for individual DUTs.

Additionally, in Japanese Unexamined Patent Publication (KOKAI) No. 8-184643, similar to the case of the Japanese Unexamined Patent Publication (KOKAI) No. 8-262102, there is disclosure of technology for remeasuring a semiconductor device that has been judged bad at the first measurement. However, there is therein no disclosure with regard to a measurement method that takes into consideration variation in measurement accuracy between a plurality of DUTs.

Accordingly, in consideration of the above-noted drawbacks in the prior art, it is an object of the present invention to provide a semiconductor device inspection apparatus and a method for inspecting a semiconductor device, which, taking into consideration variation in measurement capability and measurement accuracy among individual DUTs provided in a measurement section, while considering a prescribed compensation value in a method for evaluating measurement results, can improve the inspection accuracy with respect to semiconductor elements and devices under test, improve the accuracy classification, and reduce the technical steps.

SUMMARY OF THE INVENTION

In order to achieve the above-noted object, the present invention has the following technical constitution.

Specifically, a first aspect of the present invention is a testing equipment of the semiconductor device which performs simultaneous inspection of plurality of semiconductor devices under test and which performs classification of the semiconductor devices into prescribed categories, responsive to the results of the inspection, with utilizing a semiconductor device handler adapted for that purpose, having a mounting means for mounting sequentially the reference sample having a prescribed characteristic value into a plurality of DUT sections provided in the measurement section, a first storage means for storing the prescribed characteristic value of the reference sample, a second storage means for measuring a prescribed characteristic value of the reference sample in each of the DUT sections and storing the measurement results, a difference value calculating means for calculating the difference values between the measured value of the reference sample in each of the DUT sections as stored in the second storaging means and the prescribed characteristic values of the reference value stored in the first storage means, and determining a compensation value for each of the DUT sections, and an inspection means by using the compensation values established for each DUT section for executing prescribed inspection processing for each one of the semiconductor device units under test in each one of DUT sections simultaneously and judging the prescribed characteristics value for each one of the semiconductor devices, respectively.

A second aspect of the present invention is a method for simultaneously inspecting a plurality of semiconductor devices under test and classifying the semiconductor devices into prescribed categories, responsive to the results of the inspection, with utilizing a semiconductor device handler, whereby in order to compensate an unique characteristic inspection, capacity variations with respect to measured values of a prescribed characteristic value which each one of DUT sections provided in the measurement section inherently has, respectively between each one of DUT sections, reference samples having prescribed characteristic values for each one of the plurality of DUT sections is sequentially caused to be mounted thereon, wherein after performing a prescribed measurement, from a difference value between a prescribed reference value of a prescribed characteristic value of the reference sample and a measured value of the characteristic value a compensation value to the measured value with respect to the prescribed characteristic value for each DUT section is determined.

By employing the above-noted technical constitution, a semiconductor device inspection apparatus and method for inspecting a semiconductor device according to the present invention, used in a semiconductor device inspection apparatus, and particularly in a semiconductor device handler adapted for semiconductor device inspection, pre-stores semiconductor devices having reference data into a handler, and periodically moves reference samples among the DUT sections, performing collection of data and using the reference sample as compensation of the DUTs.

As a result, in the present invention, the compensation values are periodically and automatically measured, at a frequency that is priory input, thereby lightening the burden of the operator. In addition, because the measurement is performed automatically, by adjusting the frequency, it is possible to facilitate the adjustment of the compensation's frequency, and it possible to reduce risks, such as leakage of bad devices and reduction of yield caused by improper compensation.

BRIEF DESCRIPTIONS OF THE DRAWINGS

DETAILED DESCRIPTION OF THE PREFERRED EMBODIMENTS

Detailed embodiments of a semiconductor device inspection apparatus and a method for semiconductor device inspection according to the present invention are described in detail below, with references being made to relevant accompanying drawings.

Figure 1:
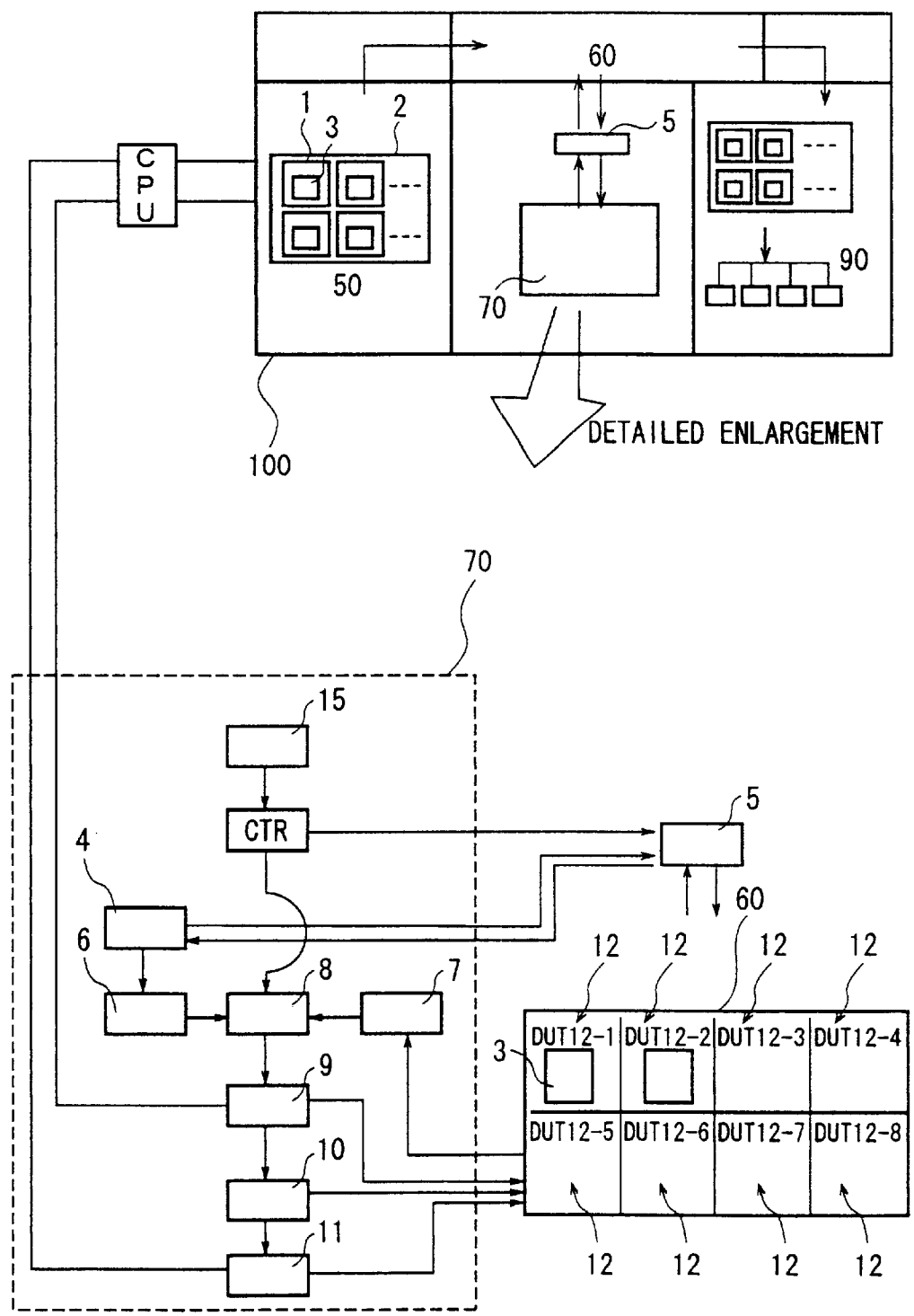
FIG. 1 is a block diagram illustrating the configuration of an example of a semiconductor device inspection apparatus according to the present invention.

Specifically, referring to FIG. 1, which is a block diagram of the main part of an example of a semiconductor device handler 100, which has a device-to-be-tested mounting apparatus 50, a measurement section 60, and an unloading apparatus 90, wherein a tray 2 that includes pockets 1 into which are housed a plurality of semiconductor devices 3 under test, and after mounting, semiconductor devices to be tested 3 into each of the pockets 1 of the tray 2, the tray 2 is moved via a prescribed route to the entrance of the measurement section, and then, by moving a plurality of semiconductor devices under test to a plurality of DUT sections, the plurality of semiconductor devices under test 3 are simultaneously inspected.

Then, responsive to the results of the inspection, the semiconductor devices 3 are classified into a failed category and passed category. The handler 100 of semiconductor device inspection apparatus is provided with a compensation value setting means 70, which measures the accuracy or sensitivity of the measurement results with respect to prescribed characteristic values established for the plurality of pockets 1 provided in the tray 2, and which determines a compensation value with respect to the accuracy or sensitivity in order to compensate the inspection results.

The compensation value setting means 70 of the semiconductor device handler 100 has a reference sample sequential mounting means 5 provided the measurement section 60 that causes reference samples 4 having prescribed characteristic values to be mounted in each of a plurality of DUT sections, simultaneously, a first storage means 6 for measuring the prescribed characteristic values of the reference samples 4 and storing the measurement results, a second storage means 7 for measuring the prescribed characteristic values of reference samples 4 in each of the DUT sections 12 and storing the measurement results, a difference value storage means 8 for comparing the measured values of the reference samples 4 in the DUT sections 12 that are stored in the second storage means 7 and the prescribed characteristic values of reference samples 4 stored in the first storage means 6 and storing the difference values therebetween, a third storage means 9 for storing the compensation values that are established for each DUT section.

Figure 3:
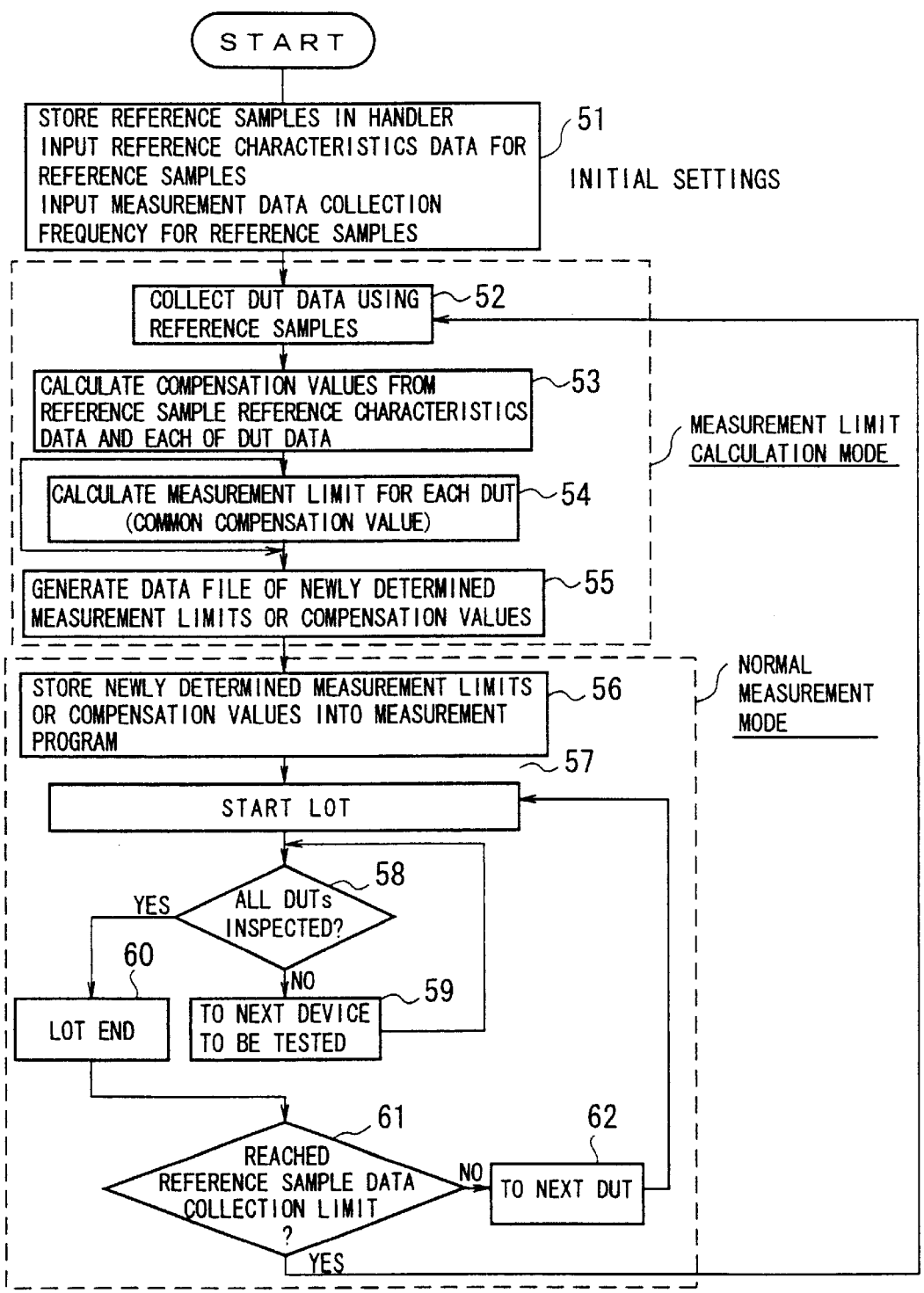
FIG. 3 is a flowchart showing illustrating an operation procedure in an example of a method for semiconductor device inspection according to the present invention.

The semiconductor device handler 100 further has a sorting means 90 that, for each of the semiconductor devices under test 3 mounted in each one of the plurality of DUT sections 12, executes a inspection processing program in the measurement section 60 into which measurement limit values established in a measurement limit calculation mode shown in FIG. 3 are captured, and classifies the semiconductor devices under test 3 in accordance with the calculation results.

In the above-noted embodiment, a compensation values for the measurement accuracies in the DUT section 12 with respect to each one of the DUT sections 12 are calculated and the compensation values are applied to the outputs with regard to prescribed characteristic values measured at each of the DUT sections 12, the corrected characteristic values being used for the output characteristic value.

In another embodiment of the present invention, however, there is additionally provided, for example, a common compensation value calculating means 10 that, from the compensation values established for each DUT section 12 within the measurement section 60, determines a common compensation value for all the DUT sections 12 within the measurement section 60, and when the common compensation value being used, prescribed inspection being executed with regard to each one of the semiconductor devices under test 3 mounted in each of the plurality of DUT sections 12 in the measurement section 60, the measurement limit values determined in the measurement limit calculation mode shown in FIG. 3, which can be obtained by utilizing the compensation values common to a plurality of DUT sections in the measuring section 60 and a measurement program is performed to make the prescribed inspection by capturing the above-mentioned measurement limit.

The above-noted common compensation value is preferably stored beforehand into an appropriate fourth storage means 11.

Compensation value information stored in the third storage means 9 or a common compensation value stored in the fourth storage means 11 are transferred to a central processing means 110 that controls the overall operation of the handler 100 of the inspection apparatus for each of the semiconductor devices.

Furthermore, the basic technical concept in the case in which a common compensation value is determined in the above-noted embodiment is, for example, one in which when the common compensation value with respect to a plurality of DUT sections 12 provided in the measuring section 60 is determined, the compensation value that is the least severe among the compensation values obtained from difference values between measurement results and reference data among specific characteristics in all the DUT section 12 is selected as the common compensation value.

In the above-noted embodiment, it is desirable that operation of calculating the compensation value with regard to a plurality of DUT sections 12 in the measurement section 60 be repeated at a prescribed frequency.

That is, it is known that, with regard to the measurement section 60, in this embodiment, by repeating the measurement, the detection accuracy with respect to a prescribed characteristic of each of the DUT sections 12, viewed in time series fashion, in the case, for example, in which a resistance component occurs because of oxidation of metal part of the socket making electrical connection between the socket of the measurement DUT section 12 of the measurement section 60 and the semiconductor device under test, or when old data is used as the compensation value there a measurement error that affects the inspection results.

Thus, it is preferable that the compensation value is adjusted in accordance with the time elapsing.

Therefore, in the present invention, with regard to the measurement section 60, for example, it is preferable that the compensation values be continually optimized, by selecting a frequency of, for example, one week interval, 10 tens interval, or one month interval.

When performing adjustment of the compensation values, a frequency setting control means 15 is provided, appropriate pre-established frequency information being input to the frequency setting control means 15 so as to enable execution.

In yet another embodiment of the present invention, after the operation of calculating the first compensation value, when a new compensation value is set by means of the frequency setting control means 15, it is desirable that the reference sample sequential mounting means 5 sequentially mounts reference samples 4 into only DUT sections 12' at pre-established positions within the plurality of DUT sections 12 of the measurement section 60, and determines the compensation values for the DUT sections 12 into which reference samples 4 have been mounted.

In the immediately previously described other embodiment of the present invention, it is desirable that the reference sample sequential mounting means 5 sequentially mount a plurality of reference samples 4 and 4' having a prescribed characteristic value, into either all of or predetermined portion of the plurality of DUT sections 12 of the measurement section 60 or in only DUT sections 12 at pre-established positions within the plurality of DUT sections 12 therein, the compensation values with respect to each one of the DUT sections 12, being determined by using a plurality of reference samples 4 and 4'.

In executing the above-noted operation, it is desirable in the case in which reference samples 4 are sequentially mounted in only DUT sections 12 at pre-established positions by the reference sample sequential mounting means 5, that the DUT sections 12' at the pre-established positions among the DUT sections 12 be specified as DUT sections 12 for which the measurement data measured in the past measuring operation with regard to the prescribed characteristic value, and collected measured data with regard to the prescribed characteristic of the DUT sections, exceeds a pre-established reference value.

It is desirable that the DUT sections 12' be selected, for example, as the DUT sections corresponding to the edge part of the measurement section 60.

Figure 2:
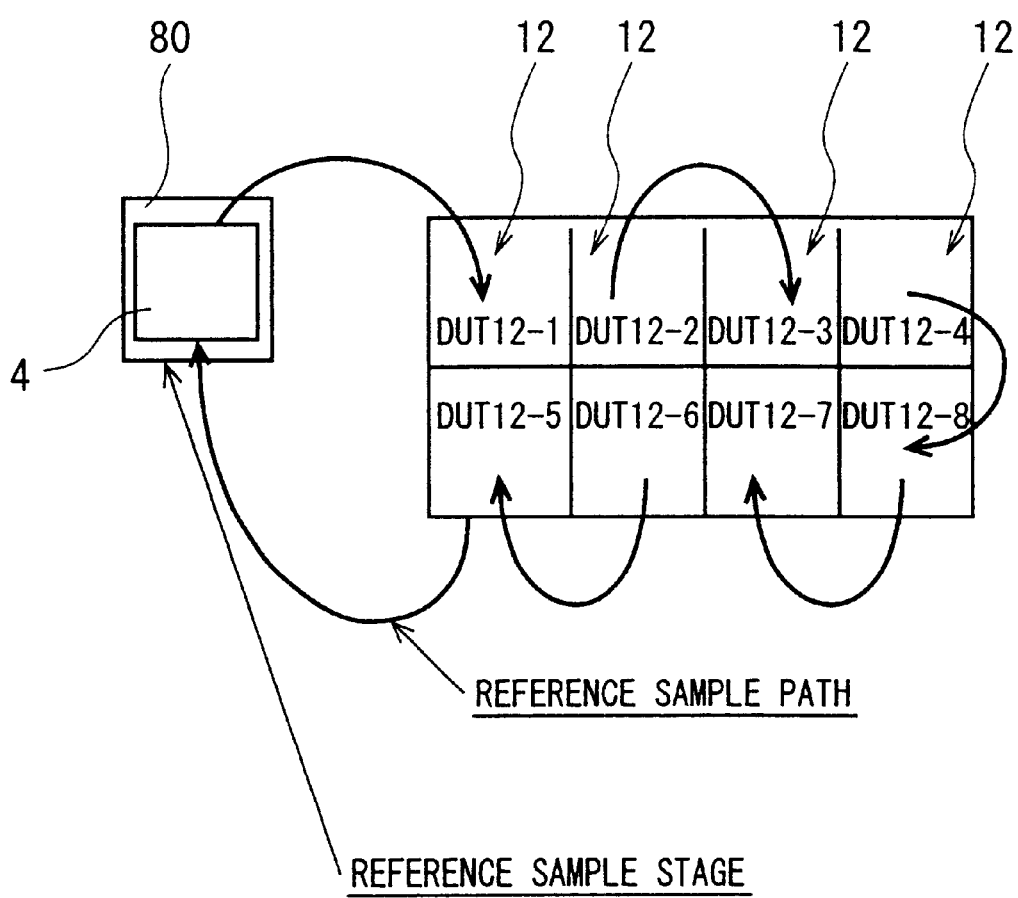
FIG. 2 is a drawing showing an example of the case in which, in a semiconductor device inspection apparatus according to the present invention, reference samples are circulated and mounted in the DUT sections.

That is, in the semiconductor device handler 100 of a semiconductor device inspection apparatus according to the present invention, particularly in a semiconductor device handler 100 of a semiconductor device inspection apparatus having a measurement section 60 with a plurality of DUT sections 12, semiconductor devices are pre-housed in the handler 100 in the semiconductor device inspection apparatus as reference samples 4 having reference data, these reference samples 4 being periodically moved to the DUT sections 12, data being collected, and this being used as the compensation values for the DUT sections, In the handler 100 of a semiconductor device inspection apparatus, as shown in FIG. 2, a storage space is provided for storing reference samples 4 having electrical characteristics data (reference data) measured by a reference tester beforehand, in addition to a function that periodically, in accordance with a number of times input when the above-noted reference sample is initially set, moves each DUT section 12 in the measurement section 60 in the handler 100 as shown in FIG. 2, a function that automatically collects electrical characteristics data of the reference samples in each DUT section 12, a function that calculates a comparison between the collected electrical characteristics data of reference samples automatically and the electrical characteristics data (reference data) measured by the reference tester and initially input, a function that generates and stores a compensation value file after the calculation, and a function that recalls the stored compensation value data in the normal measurement mode, and uses characteristics value data compensated by utilizing the compensation value to an actual measured data so as to perform an inspection of the semiconductor device under test 3.

There is an additional function that enters the measurement limit value calculation mode using the reference sample 4, when the number of times input at the initial settings is reached. That is, the basic configuration of a handler 100 of a semiconductor device inspection apparatus according to the present invention has a function that stores reference samples 4, a function that circulates the stored reference samples 4 to each of the DUT sections 12 of the measurement section 60, executes a measurement operation with regard to a prescribed characteristics value for each of the DUT sections, and collects measurement results for each DUT section as data, and has a configuration such that a comparison is made between the collected data and the reference sample data, the difference value therebetween being calculated as the compensation value, after which a semiconductor device under test 3 is mounted into each DUT section 12, an inspection of a characteristics value being made in the same manner as above, and the compensation value being used to perform correction of the measurement results.

An example of the operating procedure in a handler 100 of a semiconductor device inspection apparatus according to the present invention is described below, with reference being made to the flowchart of FIG. 3.

First, at step 51, an appropriate reference tester (not shown in the drawing) is used to execute a measurement with regard to a pre-established electrical characteristics data for the reference sample 4, and the measured data is stored into the first storage means 6 as reference data.

After the above, the period for execution of the measurement data collection, such as data indicating a period of one week, ten days, or one month is input to the frequency setting control means 15, or frequency information such as the every ten operations, every 20 operations, or 30 operations or the like is input.

Next, at step 52, a reference sample 4 is mounted in the first DUT section 12-1 of the measurement section 60, after which a measurement operation is performed by the measurement section 60 with regard to a prescribed characteristics value, and the results therefrom are stored in the second storage means 7. Then, a reference sample 4 is mounted in the second DUT section 12-2 of the measurement section 60, and the same type measurement operation is performed, the results from which are stored in the second storage means 7, after which reference samples 4 are sequentially mounted into the third to the eight DUT sections 12-3 to 12-8, measurement operations are performed with regard to each of these DUT sections, and the results therefrom are stored in the second storage means 7.

After the above, control proceeds to step 53, at which, with regard to each of the individual DUT sections 12, a difference value of a measurement sensitivity or a measurement accuracy for each one of these DUT sections 12 is calculated, respectively, from the reference data with regard to the prescribed characteristics value with respect to the reference sample 4 stored in the first storage means 6 and the prescribed characteristics value data measured at each of the DUT sections 12 stored in the second storage means 7, this being calculated by, for example, the difference value calculation means 8, these values being stored as compensation values for each of the DUT section 12 in the third storage means 9.

In the above-noted embodiment of the present invention, the calculation of the compensation values is done in terms of a difference value between the two values.

Next, at step 55, after storing the compensation values in an appropriate storage means, control proceeds to step 56, at which compensation values are read out from the storage means, after which control proceeds to step 57.

At step 57, semiconductor devices under test 3 are simultaneously mounted into each of the DUT sections 12 of the measurement section 60, and an inspection program which has captured into it the compensation values that were calculated at step 53 for the semiconductor devices under test 3 in each of the DUT sections 12, is executed to perform an inspection.

In this embodiment, after the above step 53, if necessary it is possible to have control proceed to step 54, at which, from the compensation values determined with respect to each of the DUT sections 12 of the measurement section 60 determined at step 53, a measurement limit value which is a common compensation value for the plurality of DUT sections 12 in the measurement section 60 is determined.

The measurement limit value used as a common compensation value in this embodiment is determined, for example, when the common compensation value with respect to the plurality of DUT sections provided in the measurement section 60, by first selecting the compensation value that is seemed to be the least severe among all of compensation values of all of the DUT sections with regard to all actual measurement results before inputting compensation values for each DUT with regard to each one of the item, required for the respective DUT sections as the common compensation value, this being in accordance with the technical concept of preventing the erroneous passage of bad devices.

Therefore, stated in different terms, the limit value for measured data used with respect to all DUT sections for each test item can be treated as the common compensation value in this embodiment.

After storing the above-noted limit value (common compensation value) in an appropriate storage means at step 55, control can proceeds to step 56, at which the measurement limit value is read from the storage means, after which control proceeds to step 57.

In the above case, similar to the earlier described case, at step (57) a plurality of semiconductor devices under test 3 are simultaneously mounted in the DUT sections 12 of the measurement section 60, and are moved into the measurement area 60, each of the semiconductor devices under test 3 being inspected by an inspection program into which have been captured the measurement limit values calculated at step 54.

Next, control proceeds to step 58, at which a judgment is made as to whether or not all the semiconductor devices under test have been subjected to the inspection. If YES, control proceeds to step 60, but if NOT in the step 58 the control returns to step 57 for measurement of the semiconductor devices under test, at which the above operations are repeated.

At step 60, a judgment is made that measurement of the semiconductor devices under test of a single lot has been completed is made, after which control proceeds to step 61, at which at judgment is made as to whether or not the repetition frequency (period) for collection of reference sample data set at step 1 has been reached. If NOT, control returns to step 57, from which the above operations are repeated. If YES, however, control returns to step 52, at which the above-noted steps are repeated to perform a new measurement of the compensation value or the measurement limit of each DUT.

In this embodiment of the present invention, as described above, because a compensation value or common compensation value is automatically and periodically measured at a pre-input frequency, it is possible to lighten the burden on the operator and, because an automatic measurement is performed, it is possible to facilitate the adjustment of the frequency compared to the method of the past, and it is possible to reduce risks, such as leakage of bad devices and reduction of yield caused by improper compensation.

A specific example of the determination of the compensation value and common compensation value in the above-noted embodiment of the present invention is as follows.

Specifically, using a handler 100 of a semiconductor device inspection apparatus according to the above-noted embodiment of the present invention, with regard to test items of, for example, standby current, voltage margin (MAX), voltage margin (MIN), access time, and frequency of a prescribed semiconductor device under test 3, the four DUT sections 12-1 to 12-4 of the measurement section 60 are used to perform measurements under prescribed temperature conditions, a comparison being made with respect to pre-established reference sample data, the compensation value and common compensation value determination results being as shown in the table below.

In the table 1 as shown below, the column labeled "true value" indicates the reference data of the reference sample used.

As is clear from the above table 1, in the present invention it is possible to use compensation values calculated at each DUT as is at each DUT, and additionally possible to use a common compensation value for each DUT in a tray.

In this embodiment of the present invention, in order that bad devices are not erroneously passed as good devices, with regard to individual test items for each DUT section, the compensation value for a DUT section that appears to have the best measurement results from among the reference sample measured data, that is, the compensation value in the direction that makes the true value that appears to be the least strict among the various measurement results reviewed from an external point of view, stricter, is selected as the common compensation value with respect to that characteristics value.

Another embodiment of a semiconductor device inspection apparatus and a method for inspecting a semiconductor device according to the present invention is described below, with reference to FIG. 4.

Figure 4:
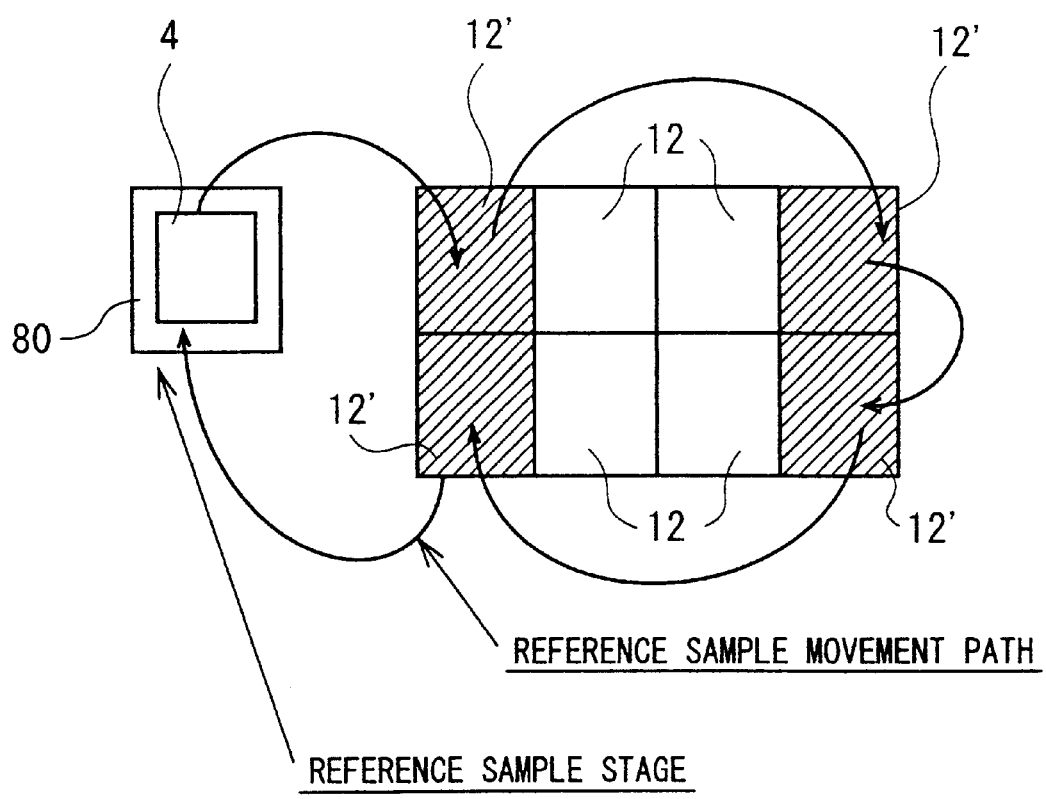
FIG. 4 is a drawing showing another example of the case in which, in a semiconductor device inspection apparatus according to the present invention, reference samples are circulated and mounted in the DUT sections.

Specifically, FIG. 4 shows an arrangement wherein, in a handler 100 of a semiconductor device inspection apparatus, reference samples 4 are sequentially mounted in each of the DUT sections 12 of the measurement section 60, by way of illustrating this example of the determination of the compensation value. Specifically, in a calculation mode for collecting compensation values or common compensation values, when performing data collection from each DUT section 12 using reference samples 4, reference samples 4 are mounted only in pre-established DUT sections 12', and compensation value data is collected only from these DUT sections 12'.

That is, in this embodiment, the compensation values of only the DUT sections 12' are updated, with compensation values for the other DUT sections 12 remaining non-updated, the result being that, when determining the common compensation value both updated and non-updated compensation values are used.

In this embodiment, for example, if it is known beforehand which DUT sections have compensation values that tend to change, it is possible to perform compensation by checking only those specific DUT sections 12'.

According to this embodiment, it is possible to shorten the time required in the calculation mode when determining a compensation value or a common compensation value.

In the above-noted embodiment, while the method of selecting the specific DUT sections 12' is not particularly restricted, it is possible, for example, to chiefly select the DUT sections 12 existing at the edges of the measurement section 60. Additionally, it is possible to store the compensation values or history of the compensation value or the common compensation value of each of the DUT sections 12 in an appropriate storage medium, for example in a memory or file in the handler (or within the tester) as data, and when a difference above a given difference occurs with respect to past compensation values, that DUT section 12' only is used in the calculation mode for collecting measurement limit value data that is either compensation value or common compensation value data. in order to collect data for establishing compensation values.

Figure 5:
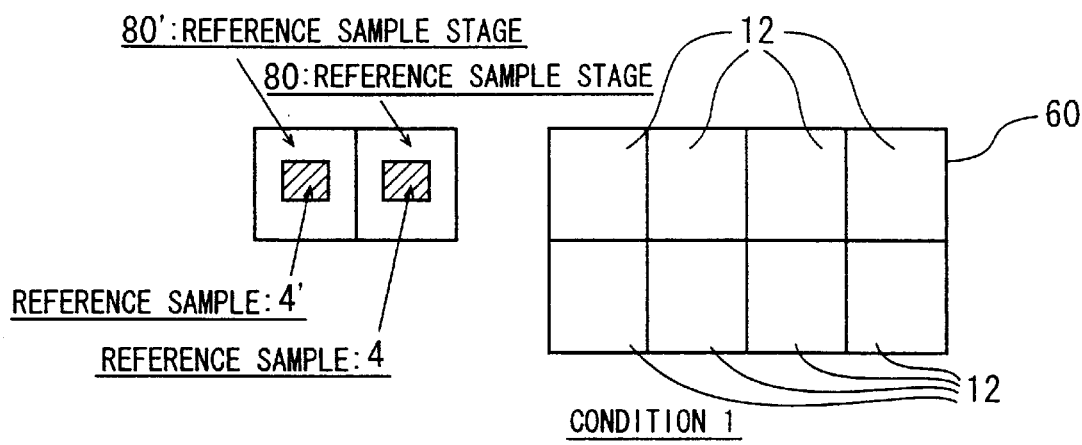
FIG. 5 is a drawing showing yet another example of the case in which, in a semiconductor device inspection apparatus according to the present invention, reference samples are circulated and mounted in the DUT sections.
Figure 5:
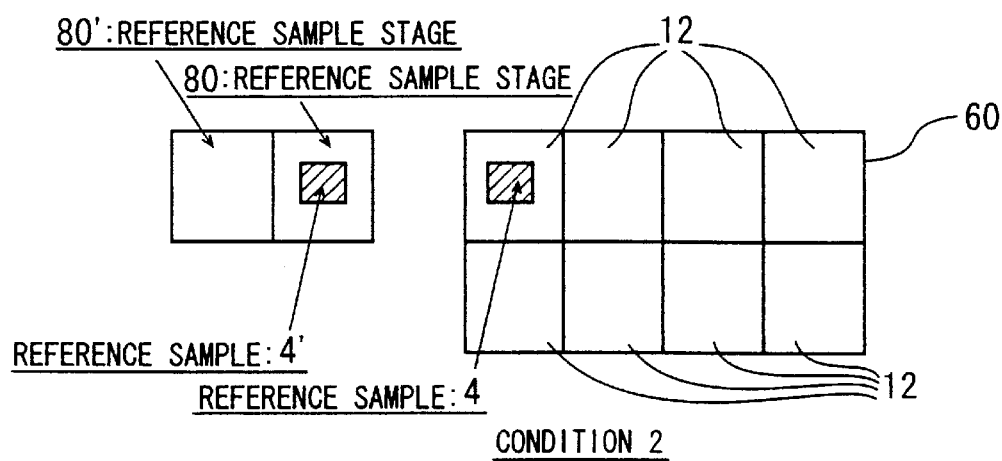
Figure 5:
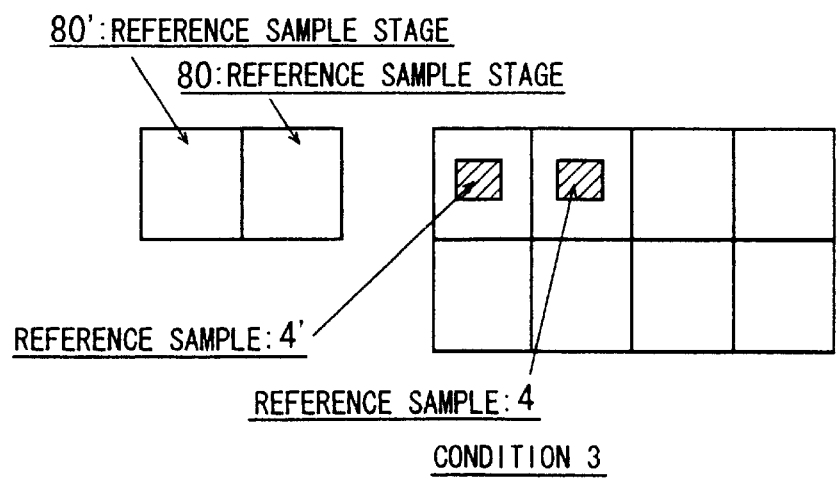

FIG. 5 is a drawing that illustrates yet another embodiment of the present invention, in which at least two types of reference samples 4 and 4' are used.

That is, a feature of this embodiment is the use of a plurality of reference samples 4, there being a storage space for the plurality of reference samples, each of these reference samples 4 and 4' having reference sample data, and the reference sample sequential mounting means 5 having a function that circulates the plurality of reference samples 4 and 4' sequentially and in the same time sequence to each of the DUT sections 12-1 to 12-8

This embodiment of the present invention is a semiconductor device inspection apparatus and a method for inspecting a semiconductor device, having a function of collecting data of each of the DUT sections 12-1 to 12-8 of the plurality of reference samples 4 and 4', wherein after determination of the compensation values from each of the DUT sections 12-1 to 12-8 for the plurality of this reference samples 4, 4' and calculation processing, such as averaging, of a plurality of compensation values of each of the DUT sections 12-1 to 12-8 determined with the plurality of reference samples 4 and 4', the compensation value for those DUT sections are determined and used for each DUT section.

In the present invention, it is possible to perform measurement operations independently under different temperature conditions with regard to a prescribed characteristic value, and to determine the measured values thereof.

For example, in the above-noted embodiment, at a plurality of temperatures, the semiconductor device under test 3 is measured with regard to the prescribed characteristic value and the compensation value is determined. In doing so, with reference samples stored in the handler at the plurality of temperatures, for example at −5°, 25°, and 90° reference samples are caused to circulate the DUT sections while being housed within the handler, the prescribed characteristics value data for each of the DUT sections 12-1 to 12-8 being measured as data, while at the same plurality of temperatures as were used for measurement of the characteristics values of the reference samples 4, for example at −5°, 25°, and 90° the devices under test are mounted into the DUT sections 12-1 to 12-8 of the measurement section 60 within the handler, and measurements are performed of characteristics values under the same conditions.

In this embodiment of the present invention, data collected as measured data at a plurality of temperature conditions are compared with reference sample data at the same corresponding temperatures and, after calculating the compensation values at each temperature, the program is caused to reflect these as compensation values for measurement limit values at the plurality of temperatures, the semiconductor device inspection apparatus having a function which, when measuring at each of the temperatures calculates the compensated values at each measurement temperature.

As is clear from the above-noted embodiment of the present invention, the method for inspecting a semiconductor device according to the present invention has the following steps.

Specifically, a method for inspecting a semiconductor device according to the present invention is one in which in semiconductor device inspection apparatus configured so that, in response to the inspection results obtained from simultaneously inspecting a plurality of semiconductor devices, semiconductor devices under test are classified into prescribed categories, and so as to include a unloading section, a device under test mounting section, and a measurement section, in order to compensate for the characteristic detection variation with respect to measurements with regard to prescribed test items that are inherent in a plurality of DUT sections provided in the measurement section, reference samples having prescribed characteristics values are sequentially mounted in the plurality of DUT sections and a prescribed measurement is performed, after which from the difference between a pre-established reference value with regard to a measured value of prescribed characteristics value of the reference samples and the measured value, a compensation value with respect to the measured value of prescribed characteristics value of each DUT section is determined.

In a method for inspecting a semiconductor device according to the present invention, it is preferable that semiconductor devices under test are mounted into each of a plurality of DUT sections provided in the measurement section and then a measurement of a pre-established test item is performed under prescribed conditions, the compensation value obtained for each DUT section being used to employ a corrected measurement limit value with respect to the measured value of the test item so as to inspect the specific test item of the semiconductor device under test in each individual DUT section.

Additionally, it is preferable in a method for inspecting a semiconductor device according to the present invention that the semiconductor device inspection apparatus have an inspection means whereby a common compensation value for all DUT sections in the measurement section is determined from the compensation values for each individual DUT section, and whereby, with regard to each semiconductor device under test of the plurality of semiconductor devices under test in the measurement section, a limit value that is compensated using this common compensation value is used to execute a prescribed inspection simultaneously, thereby determining a prescribed test item for each of the semiconductor devices.

Further, it is desirable that a method for inspecting semiconductor devices according to the present invention be configured such that, when determining a common compensation value for a plurality of DUT sections provided in the measurement section, the compensation value of the DUT section for which the measurement results appear the least severe among characteristics values of all the DUT sections is selected as the common compensation value.

It is further desirable that a method for inspecting semiconductor devices according to the present invention be configured so that operation of calculating a compensation value with regard to the plurality of DUT sections provided in the measurement section be repeated at a prescribed frequency.

Additionally, it is desirable that a method for inspecting semiconductor devices be configured so that, after completion of the operation of calculation of the first compensation value, if compensation values are to be calculated anew for each DUT section in the measurement section, the reference sample sequential mounting means sequentially mounts a reference sample in only a DUT section at a pre-established position of the plurality of DUT sections of the measurement section, the compensation value being determined for the DUT section into which the reference sample has been mounted.

Additionally, in a method for inspecting a semiconductor device according to the present invention, when reference samples are sequentially mounted in only DUT sections at pre-established positions by the sample sequential mounting means, DUT sections are selected for which data measured in past characteristics value measurement operations exhibits variation that exceeds a prescribed reference value.

In the above-noted case, it is desirable that a DUT section which exhibits variation that exceeds a pre-established reference value be a DUT section at an edge of the measurement section.

In a method for inspecting a semiconductor device according to the present invention, it is possible to sequentially mount a plurality of prepared reference sample having prescribed characteristics values into all or a pre-established part of the plurality of DUT sections in the measurement section, a plurality of reference samples being used to determine compensation values with regard to each of the DUT sections.

Additionally, in a method for inspecting a semiconductor device according to the present invention, it is possible to use a configuration in which the number of updates of a compensation value for a pre-established DUT section is different than the number of updates of the compensation value with respect to another DUT section.

In a method for inspecting a semiconductor device according to the present invention, it is desirable that, when measuring a prescribed characteristics value with respect to devices under test mounted in a plurality of DUT sections of the measurement section, the temperature conditions be varied in a number of steps and measurements be performed at each condition.

By adopting the technical constitution described in detail above, a semiconductor device inspection apparatus and method for inspecting a semiconductor device according to the present invention performs automatic periodic measurement of a compensation value or a common compensation value at a pre-established frequency, and can therefore be expected to reduce the burden on an operator. Additionally, by performing measurements automatically, by adjusting the frequency optimization of the frequency is facilitated, and it is possible to reduce the erroneous passing of bad devices and poor yield that can occur when the compensation value is not optimized.

TABLE 1

| TEST ITEM | DATA | DUT1-1 | DUT1-2 | DUT1-3 | DUT1-4 | TRUE VALUE | COMMON COMPENSATION VALUE |
|---|---|---|---|---|---|---|---|
| STANBAY CURRENT | MEASURED VALUE | 1.3 mA | 1.4 mA | 1.5 mA | 1.0 mA | 1.3 mA | — |
|  | COMPENSATION VALUE | 0.0 mA | 0.1 mA | −0.2 mA | +0.3 mA | — | +0.3 mA |
| VOLTAGE MARGIN | MEASURED VALUE | 5.12 V | 5.10 V | 5.08 V | 5.14 V | 5.10 V | — |
| (MAX) | COMPENSATION VALUE | −0.02 V | 0.00 V | +0.02 V | −0.04 V | — | −0.04 V |
| VOLTAGE MARGIN | MEASURED VALUE | 2.62 V | 2.58 V | 2.56 V | 2.64 V | 2.60 V | — |
| (MIN) | COMPENSATION VALUE | −0.02 V | +0.02 V | +0.04 V | −0.04 V | — | +0.04 V |
| ACCESS TIME | MEASURED VALUE | 2.98 n | 3.02 n | 3.04 n | 2.96 n | 3.00 n | — |
|  | COMPENSATION VALUE | +0.02 n | −0.02 n | −0.04 n | +0.04 n | — | +0.04 n |
| FREQUENCY | MEASURED VALUE | 295 MHZ | 305 MHZ | 296 MHZ | 307 MHZ | 300 MHZ | — |
|  | COMPENSATION VALUE | +2 MHZ | −5 MHZ | +4 MHZ | −7 MHZ | — | −7 MHZ |

What is claimed:

1. A testing equipment of semiconductor device for performing simultaneous inspection of plurality of semiconductor devices under test and performing classification of said semiconductor devices into prescribed categories, responsive to the results of said inspection, with utilizing a semiconductor device handler adapted for that purpose, comprising:

a sequential mounting means for mounting a reference sample having data for prescribed characteristic item, into a plurality of DUT sections provided in a measurement section;

a first storage means for storing said prescribed characteristic item of the reference sample;

a second storage means for measuring said data of a prescribed characteristic item of said reference sample in each of said DUT sections and storing measurement results;

a calculating means for calculating a difference value between said measured value of said reference sample in each of said DUT sections as stored in said second storage means, and said data of a prescribed characteristic item of said reference value stored in said first storage means, and determining a compensation value for each of said DUT sections; and a testing means using program with said compensation values established by said reference sample for each DUT section in order to execute prescribed inspection processing for each semiconductor devices unit under test in each DUT sections simultaneously and judge the samples characteristics for each one of said semiconductor devices, respectively; and a frequency setting control means for repeating a calculation operation for determining said compensation value for said plurality of DUT sections of said measurement section with a prescribed frequency.

2. A testing equipment of the semiconductor device according to claim 1, further comprising a determining means for determining a common compensation value, which is determined from each of DUT sections of said measurement section and is the common value to all DUT sections, and an inspection means which uses said common compensation value to execute a prescribed inspection performed simultaneously on semiconductor devices under test mounted in a plurality of DUT sections of said measurement section, respectively, thereby judging the characteristics for each of said semiconductor devices.

3. A testing equipment of the semiconductor device according to claim 1, wherein, after completion of calculation of an initial compensation value, if a new compensation value is to be determined, said reference sample sequential mounting means sequentially mounts reference samples in only preestablished DUT sections of said plurality of DUT sections of said measurement section, and determines a compensation value of said DUT sections into which reference samples have been mounted.

4. A testing equipment of the semiconductor device according to claim 3, wherein when said reference sample sequential mounting means sequentially mounts a reference sample into a DUT section at only a preestablished position, said DUT section at said pre-established position is a DUT section at a position at which measurement data with regard to a prescribed characteristics value collected in the past measuring operation for said characteristic values exhibit variation exceeding a pre-established reference value.

5. A testing equipment of the semiconductor device according to claim 1, wherein said reference sample sequential mounting means causes reference samples to be sequentially moved into all or a preestablished part of said plurality of DUT sections of said measurement section, and said plurality of reference samples are used to determine said compensation value for each of said DUT sections into which said reference samples are mounted.

6. A method for simultaneously inspecting a plurality of semiconductor devices under test and classifying said semiconductor devices into prescribed categories, responsive to the results of said inspection, with utilizing a semiconductor device handler, whereby in order to compensate a unique characteristic inspection capacity variations with respect to measured values of a prescribed characteristics item which each one of a plurality of DUT sections provided in a measurement section inherently has, respectively, between each of said DUT sections, reference samples having prescribed characteristic item for each one of said plurality of DUT sections is sequentially caused to be mounted thereon, wherein after performing a prescribed measurement, from a difference value between a prescribed reference value of a prescribed characteristics item for said reference sample and a measured value of said characteristic item, a compensation value to said measured value with respect to said prescribed characteristics item for each DUT section is determined, whereby an operation of determining said compensation value with regard to said plurality of DUT sections in said measurement section is repeatedly performed with a prescribed frequency.

7. A method for inspecting a semiconductor device according to claim 6, whereby, after mounting semiconductor devices under test into each of said plurality of DUT sections of said measurement section, a measurement is performed of a pre-established characteristics item under prescribed conditions for each semiconductor device under test, and further whereby compensation is performed of measured value obtained for said characteristics item, using said compensation value for each DUT section, said compensated values of said prescribed characteristics item for said semiconductor device under test in said prescribed DUT section being taken as actually measured data.

8. A method for inspecting a semiconductor device according to claim 6, whereby a compensation value common to all DUT sections in said measurement section is determined from compensation values determined for each DUT section within said measurement section, said common compensation value being used by an inspection means to perform simultaneous inspection of each semiconductor device under test mounted in each of said plurality of DUT sections of said measurement section so as to determine said prescribed characteristic value of each one of said semiconductor devices under the test.

9. A method for inspecting a semiconductor device according to claim 8, whereby, when determining a compensation value common to said plurality of DUT sections provided in said measurement section, a compensation value with a largest absolute value of all the prescribed characteristics value of said plurality of DUT sections is taken as said common compensation value.

10. A method for inspecting a semiconductor device according to claim 6, whereby after completion of an operation of determining of an initial compensation value, when a compensation value for each said DUT section of said measurement section is further to be determined, in a process of sequentially measuring said reference sample in said DUT section, sequentially a reference sample is mounted in only a DUT section at a pre-established position of said plurality of DUT sections of said measurement section, and said compensation value being determined for said DUT section into which said reference sample has been mounted.

11. A method for inspecting a semiconductor device according to claim 10, whereby when said reference samples are sequentially mounted in only DUT sections at pre-established positions by a sample sequential mounting means, DUT sections are selected for which data measured in past characteristics value measurement operations exhibits variation exceeding a prescribed reference value as said prescribed portion of DUT in said DUT section.

12. A method for inspecting a semiconductor device according to claim 11, wherein said DUT section which exhibits a variation exceeding a pre-established reference value is a DUT section at a physical edge of said measurement section.

13. A method for inspecting a semiconductor device according to claim 6, whereby a plurality of prepared reference samples having prescribed characteristics values are caused to be mounted into all or a pre-established part of said plurality of DUT sections in said measurement section, a plurality of reference samples being used to determine compensation values with regard to each of the DUT sections.

14. A method for inspecting a semiconductor device, according to claim 6, whereby a number of updates of a compensation value for a pre-established DUT section is different than a number of updates of said compensation value with respect to another DUT section.

15. A method for inspecting a semiconductor device according to claim 6, whereby when measuring a prescribed characteristics value with respect to devices under test mounted in a plurality of DUT sections of said measurement section, respectively, said temperature conditions are varied and measurements are performed at each condition.

* * * * *